United States Patent
Lee et al.

(10) Patent No.: US 6,835,640 B2
(45) Date of Patent: Dec. 28, 2004

(54) METHOD OF FORMING A NOVEL COMPOSITE INSULATOR SPACER

(75) Inventors: Hsiang-Fan Lee, Da-Li (TW); Chi-Hsin Lo, Hsinchu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 15 days.

(21) Appl. No.: 10/313,500

(22) Filed: Dec. 6, 2002

(65) Prior Publication Data

US 2004/0110363 A1 Jun. 10, 2004

(51) Int. Cl.[7] .................. H01L 21/3205; H01L 21/311; H01L 21/76; H01L 21/336
(52) U.S. Cl. ................. 438/595; 438/446; 438/696; 438/303
(58) Field of Search ................. 438/446, 448, 438/696, 303, 595, 230, 231, 232, 706, 738, 304, 305, 306, 307, 267, 366

(56) References Cited

U.S. PATENT DOCUMENTS

| | | | | |
|---|---|---|---|---|
| 5,783,475 A | * | 7/1998 | Ramaswami | 438/303 |
| 6,004,851 A | * | 12/1999 | Peng | 438/301 |
| 6,104,055 A | * | 8/2000 | Watanabe | 257/309 |
| 6,265,283 B1 | * | 7/2001 | Nariman et al. | 438/424 |
| 6,306,760 B1 | * | 10/2001 | Hsu et al. | 438/639 |
| 6,342,452 B1 | | 1/2002 | Coronel et al. | 438/710 |
| 6,346,482 B2 | | 2/2002 | Matsumoto et al. | 438/706 |
| 6,355,572 B1 | | 3/2002 | Ikegami | 438/706 |
| 6,376,384 B1 | | 4/2002 | Yen et al. | 438/706 |
| 6,506,653 B1 | * | 1/2003 | Furukawa et al. | 438/305 |

\* cited by examiner

*Primary Examiner*—Matthew Smith
*Assistant Examiner*—Chuong Anh Luu

(57) ABSTRACT

A method of defining composite insulator spacers on the sides of conductive gate structures, with reduced risk of semiconductor damage at end point of the composite insulator spacer definition procedure, has been developed. The method features initial deposition of a thin underlying, silicon rich, undoped silica glass (USG), layer, comprised with a refractive index greater than 1.55. After deposition of a TEOS silicon oxide layer a first phase of an anisotropic RIE procedure, using a $CF_4/CHF_3$ etch chemistry, is used to selectively define a silicon oxide spacer component, with the first phase of the etch procedure terminating on the underlying silicon rich, USG layer. A second phase of the anisotropic RIE procedure is then employed using $C_4F_8/CO/Ar$ as an etchant, selectively defining the underlying silicon rich, USG spacer component of the composite insulator spacer, with the second phase of the anisotropic RIE procedure selectively terminating at the surface of the semiconductor substrate, thus reducing the risk of substrate damage.

21 Claims, 3 Drawing Sheets

METHOD OF FORMING A NOVEL COMPOSITE INSULATOR SPACER

Figure 1:
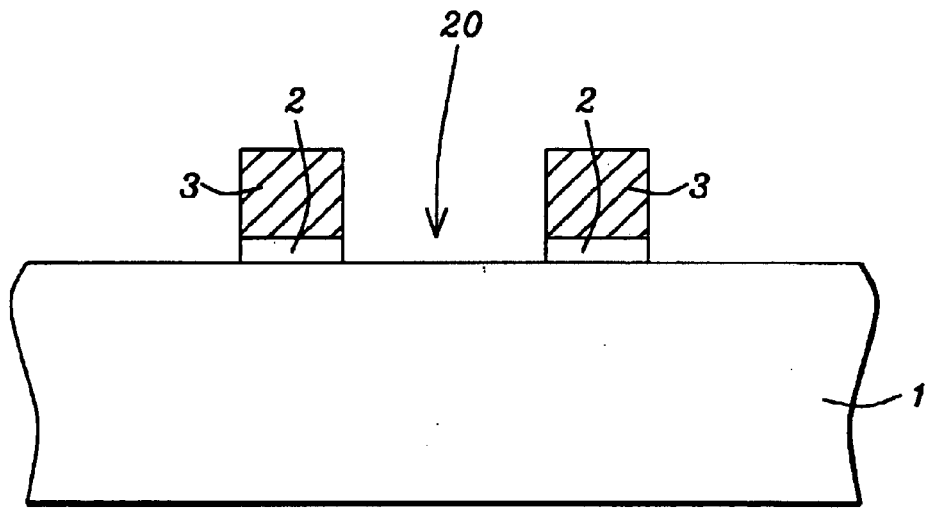

BACKGROUND OF THE INVENTION (1) Field of the Invention

The present invention relates to methods used to fabricate semiconductor devices, and more specifically to a method used to form a composite insulator spacer on the sides of a metal oxide semiconductor field effect transistor (MOSFET), gate structure.

(2) Description of Prior Art

The emergence of micro-miniaturization, or the ability to fabricate semiconductor devices with sub-micron features, has allowed the performance of the sub-Micron devices to be increased while the processing costs for these same devices has been reduced. Reduction in performance degrading parasitic junction capacitance, in addition to the ability to obtain a greater amount of smaller semiconductor chips comprised with sub-micron features, from a specific size starting substrate, has allowed the desired performance and costs enhancements to be realized. However as device features shrink specific phenomena not present for devices comprised with larger features can arise. For example during dry etching procedures a micro-loading phenomena, or the phenomena of increased etch rates in areas of densely packed features, can adversely influence yield and reliability of devices formed with sub-micron features. For example the definition of insulator spacers formed on the sides of gate structures, can be influenced by the spacing between gate structures. The etch rate for the anisotropic reactive ion etch (RIE), procedure used for insulator spacer definition can be greater in an area of the semiconductor chip in which the spacing between gate structures is less when compared to an area of the semiconductor chip in which the spacing between gate structures is greater. While insulator spacer definition is still continuing in less dense regions the enhanced etch rate of insulator in the densely packed regions can result in insulator spacing thinning or attack of the semiconductor surface located between the densely packed gate structures. This deleterious phenomena can result in yield and performance degradation of a semiconductor device, such as a dynamic random access memory (DRAM), device, in which the device refresh time (TREF), can be degraded if the semiconductor is attacked during insulator spacer definition.

This invention will describe a novel composite insulator spacer, and the method used to define the novel composite spacer on the sides of MOSFET gate structures. The present invention will feature spacer materials and etch chemistries which allow increased etch rate selectivity to be achieved, thus reducing the risk of enhanced etching in tightly packed spaces, thus preserving the integrity of the device. Prior art such as Yen et al, in U.S. Pat. No. 6,376,384 B1, Ikegami, in U.S. Pat. No. 6,355,572 B1, Matsumoto et al, in U.S. Pat. No. 6,346,482 B2, and Coronel et al, in U.S. Pat. No. 6,342,452 B1, describe methods of etching dielectric layers. However none of the above prior art describe the novel features of the present invention in which the combination of composite insulator materials and etch chemistries are used to define composite insulator spacers on the sides of either tightly packed or less densely packed gate structures.

SUMMARY OF THE INVENTION

It is an object of this invention to form a composite insulator spacer on the sides of a metal oxide semiconductor field effect (MOSFET), gate structure.

It is another object of this invention to employ a selective dry etch procedure for the composite insulator spacer in which the material chosen for the underlying insulator component of the composite insulator spacer features a lower etch rate than the material chosen for the overlying insulator component of the composite insulator spacer, using a first dry etch chemistry.

It is still another object of this invention to employ a selective dry etch procedure for the composite insulator spacer in which the material chosen for the underlying insulator component of the composite insulator spacer features a higher etch rate than the etch rate of the semiconductor substrate, using a second dry etch chemistry.

In accordance with the present invention a method of defining a composite insulator spacer on the sides of a gate structure, using a selective dry etch procedure with reduced micro-loading phenomena and thus less risk of semiconductor damage, is described. After definition of a conductive gate structure on an underlying gate insulator layer, a thin layer of undoped silicate glass (USG), layer is deposited. A silicon oxide layer, obtained using tetraethylorthosilicate (TEOS), as a source is deposited on the USG layer. A first phase of a dry etch procedure used to define a composite insulator spacer on the sides of the conductive gate structure, is performed using a first etch chemistry featuring a high etch rate selectivity of TEOS silicon oxide to underlying USG. At the appearance of the USG layer a second phase of the dry etch procedure, employing a second etch chemistry is initiated, featuring a high etch rate selectivity of USG insulator to underlying silicon, allowing the second phase of the dry etch procedure to terminate at the appearance of the surface of the semiconductor substrate. The selective dry etch procedure reduces the risk of semiconductor damage, even in narrow spaces located between conductive gate structures.

BRIEF DESCRIPTION OF THE INVENTION

The object and other advantages of this invention will best be described in the preferred embodiments with reference to the attached drawings that include:

FIGS. 1–6, which schematically in cross-sectional style describe key stages used to define a composite insulator spacer on the sides of a conductive gate structure featuring a selective dry etch procedure employed to reduce the risk of semiconductor damage in narrow spaces located between gate structures, at the conclusion of the composite insulator spacer definition procedure.

DESCRIPTION OF THE PREFERRED EMBODIMENTS

The method of forming a composite insulator spacer on the sides of a conductive gate structure featuring a selective, two phase dry etch procedure, employed to reduce the risk of semiconductor damage in narrow spaces located between gate structures, at the conclusion of the composite insulator spacer definition procedure, will now be described in detail. Semiconductor substrate 1, comprised of single crystalline, P type silicon, with a <100> crystallographic orientation is used and schematically shown in FIG. 1. Gate insulator layer 2, comprised of silicon dioxide is obtained via a thermal oxidation procedure, performed in an oxygen-steam ambient. A conductive layer such as polysilicon is next deposited via low pressure chemical vapor deposition (LPCVD), procedures, using silane or disilane as a source. The polysilicon layer can be a doped polysilicon layer, doped in situ during deposition via the addition of phosphine or arsine to the silane or disilane ambient, or the polysilicon layer can be deposited intrinsically then doped via implantation of arsenic or phosphorous ions. A photoresist shape (not shown in the drawings), is used as a mask to allow an anisotropic reactive ion etch (RIE), procedure to define conductive gate, or polysilicon gate structures 3. The RIE procedure is performed using $Cl_2$ or $SF_6$ as a selective etchant for polysilicon, with the procedure selectively terminating at the appearance of gate insulator layer 2. Removal of the photoresist shape is accomplished via plasma oxygen ashing procedures followed by wet clean procedures. A buffered hydrofluoric acid component of the post plasma oxygen ashing procedure results in removal of the portions of gate insulator layer 2, not covered by polysilicon gate structure 3. A the narrowest space 20, located between polysilicon gate structures 3, is schematically shown in FIG. 1. If desired a lightly doped source/drain region can now be formed via implantation of ions in portions of semiconductor substrate 1, not covered by polysilicon gate structures 3. This is not shown in the drawings.

Figure 2:
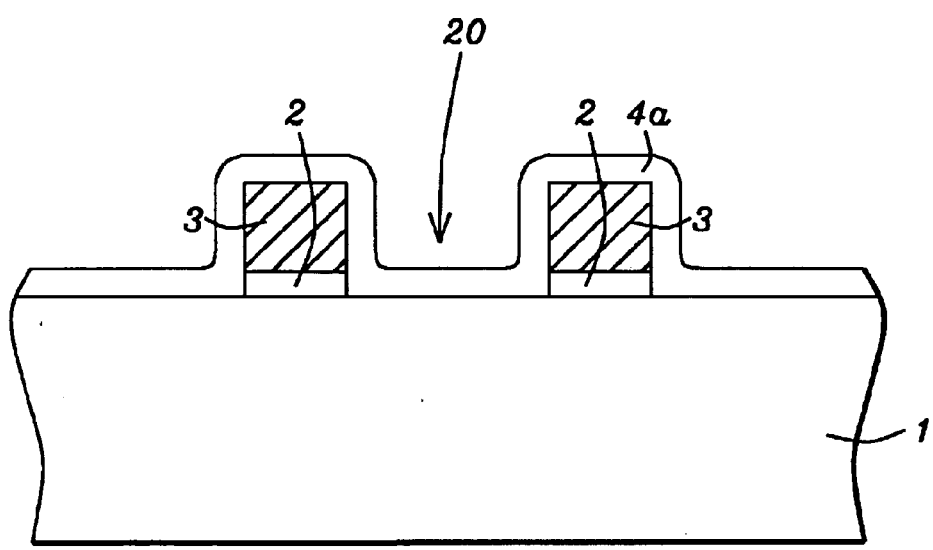
Figure 3:
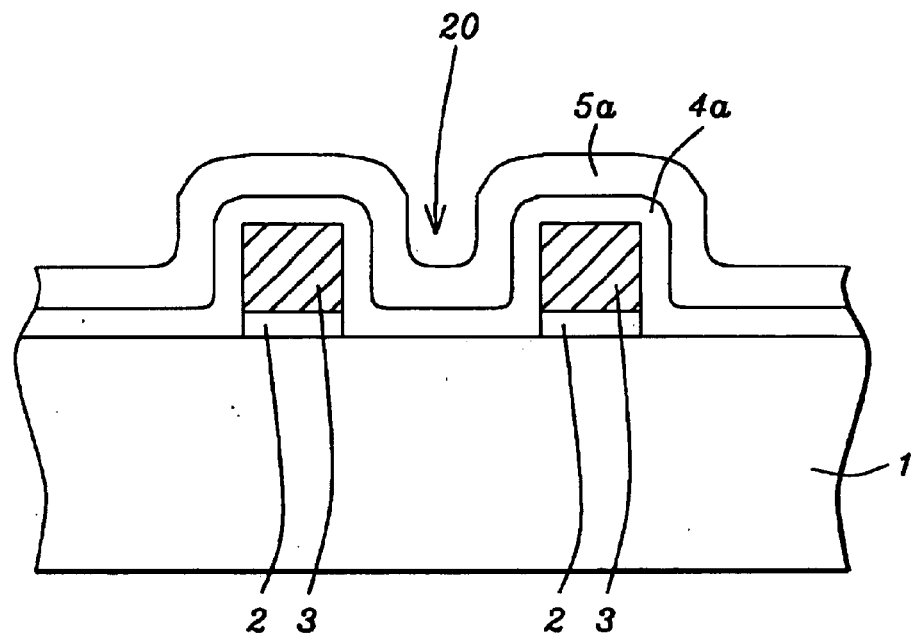

Undoped silicate glass (USG), layer 4a, is next conformally deposited via LPCVD or via plasma enhanced chemical vapor deposition (PECVD), procedures. USG layer 4a, shown schematically in FIG. 2, is a silicon rich silicon oxide layer, deposited using a silane to nitrous oxide ratio high enough to result in a refractive index between about 1.55 to 1.90. The silicon rich, or high refractive index of USG layer 4a, will enable the desired dry etch rate selectivities to be realized for subsequent definition of the composite insulator spacer. Silicon oxide layer 5a, shown schematically in FIG. 3, is next conformally deposited via LPCVD or PECVD procedures, using TEOS as a source. The non-silicon rich, silicon oxide layer 5a, is formed with a refractive index less than the refractive index of USG layer 4a.

Figure 4:
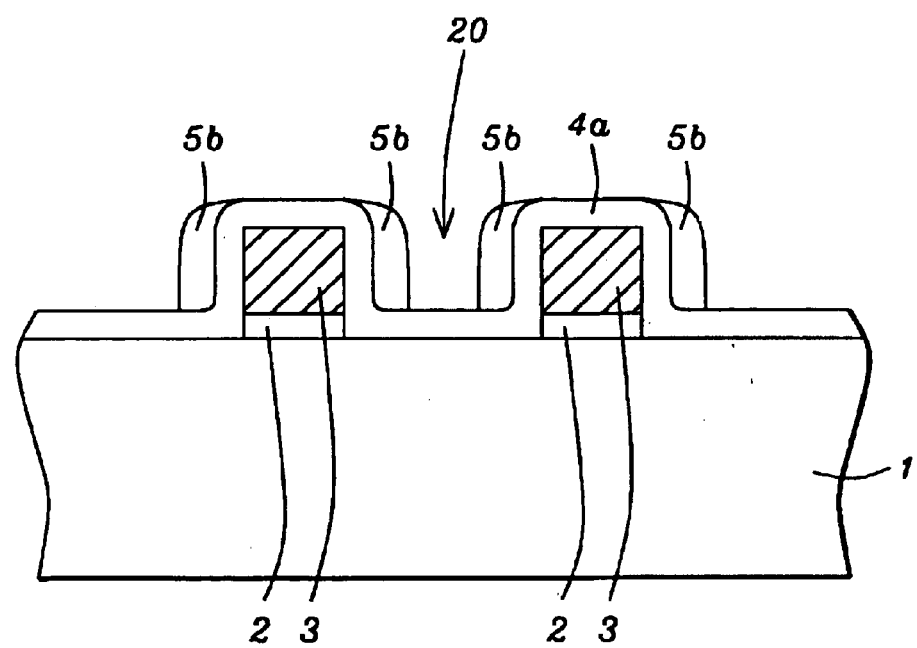

A first phase of an anisotropic RIE procedure is next employed using $CF_4/CHF_3$ as an etchant. The etch rate ratio, or etch selectivity of silicon oxide layer 5a, to USG, silicon rich silicon oxide layer 4a, is between about 1.5 to 1, to 10 to 1. The high etch rate ratio of silicon oxide layer 5a, to USG layer 4a, allows definition of silicon oxide spacer component 5b, to be realized, with the first phase of the anisotropic RIE procedure slowing at the appearance of USG layer 4a. The high silicon content of silicon rich USG layer 4a, was the prime factor in preventing removal of this layer in the $CF_4/CHF_3$ etch ambient. The result of this procedure is schematically shown in FIG. 4.

Figure 5:
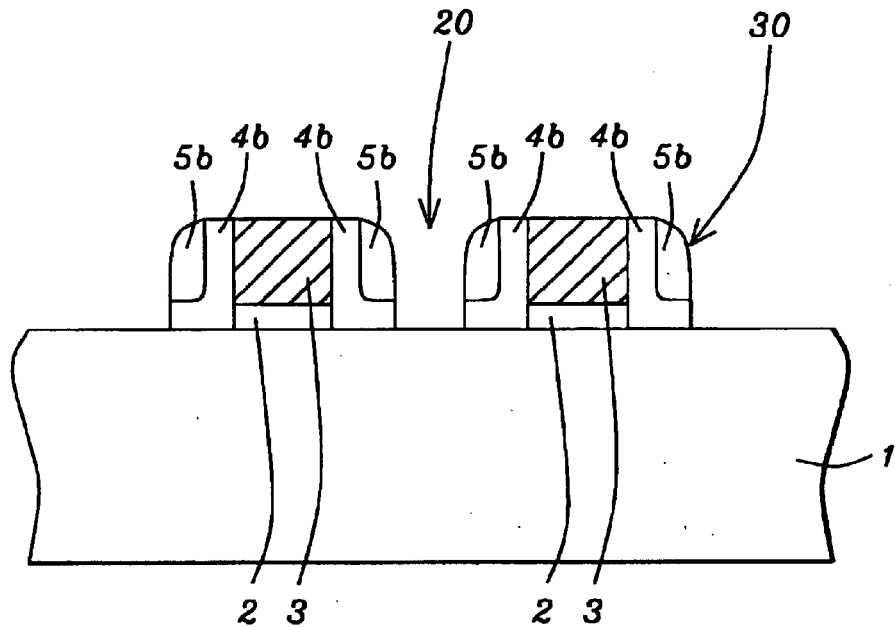
Figure 6:
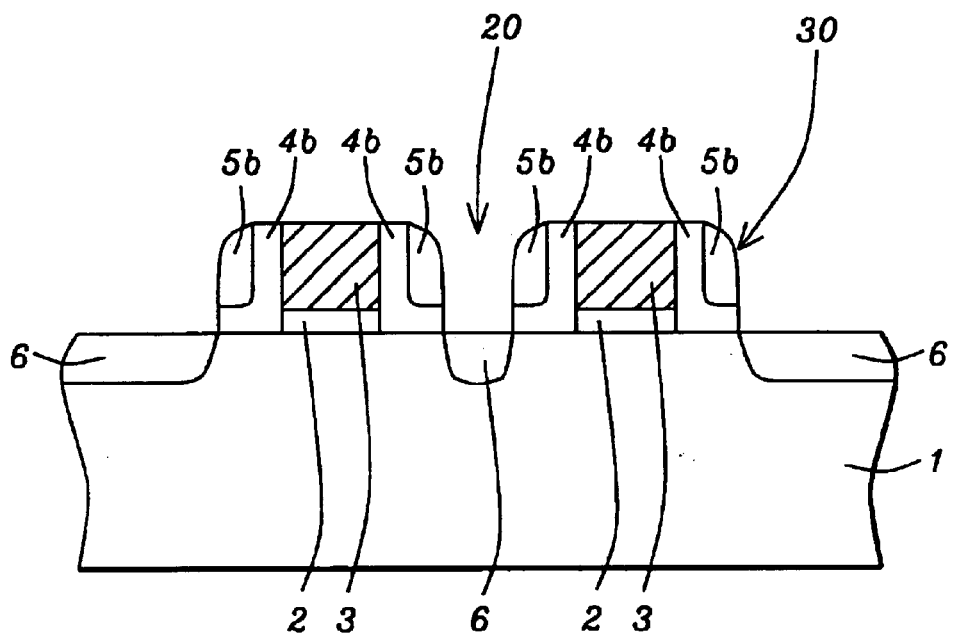

The second phase of the anisotropic RIE procedure is next employed using a $C_4F_8/CO/Ar$ etch ambient. This etch chemistry results in enhanced etching of silicon rich, USG layer 4a, when compared to the lower etch rates of silicon and silicon oxide spacer component 5b, subjected to the same etch chemistry. The etch rate ratio of USG layer 4a, to silicon or semiconductor substrate 1, is between about 3 to 1, to 100 to 1, allowing the second phase of the anisotropic RIE procedure to terminate at the appearance of semiconductor substrate 1. This selectivity, the etch rate of USG layer 4a, to silicon, reduces the risk of silicon damage at the conclusion of the RIE procedure. Of greatest importance is the absence of a micro-loading phenomena which would attack exposed silicon in the narrowest spaces between gate structures, however the use of the $C_4F_8/CO/Ar$ chemistry allowed the definition of thin USG spacer component 4b, to be accomplished in space 20, without silicon damage resulting from micro-loading. The second phase of the anisotropic RIE procedure, using $C_4F_8/CO/Ar$, also results in a minimum of thinning for the exposed, defined silicon oxide spacer component 5b. The etch rate ratio of USG layer 4a, to silicon oxide spacer component 5b, in $C_4F_8/CO/Ar$, is between about 1.5 to 1, to 20 to 1. The result of the second anisotropic RIE procedure, resulting in the definition of composite insulator spacer 30, comprised of overlying silicon oxide spacer component 5b, and underlying USG spacer component 4b, is schematically shown in FIG. 5. The composite insulator spacer described in the present invention can be applied to any MOSFET device, specifically to embedded dynamic random access memory (EDRAM), devices, in which the space between gate structures is narrow, wherein the spacer definition procedure of this invention prevents silicon damage and allows the designed EDRAM refresh time parameter to be preserved.

Formation of heavily doped source/drain region 6, is next accomplished via implantation of arsenic or phosphorous ions, in portions of semiconductor substrate 1, not covered by polysilicon gate structures 3, or by composite insulator spacers 30. This is shown schematically in FIG. 6. Although this invention is described for a N channel MOSFET device, it can also be applied to a P channel MOSFET device.

While this invention has been particularly shown and described with reference to the preferred embodiments thereof, it will be understood by those skilled in the art that various changes in form and details may be made without departing from the spirit and scope of this invention.

What is claimed is:

1. A method of forming composite insulator spacers on the sides of conductive gate structures, on a semiconductor substrate, comprising the steps of:

growing a gate insulator layer on said semiconductor substrate;

forming conductive gate structures on said gate insulator layer;

depositing a first insulator layer;

depositing a second insulator layer;

performing a first phase of an anisotropic dry etch procedure to form second insulator spacer components on said first insulator layer, with said first phase of said anisotropic dry etching procedure selectively terminating on said first insulator layer; and performing a second phase of said anisotropic dry etch procedure wherein the etch rate ratio of said first insulator layer to said second insulator layer is between about 1.5 to 1, to 20 to 1, and the etch rate ratio of said first insulator layer to said semiconductor substrate is between about 3 to 1, to 100 to 1, to form first insulator spacer components, resulting in definition of said composite insulator spacers located on sides of said conductive gate structure with said composite insulator spacers comprised of said second insulator spacer components overlying said first insulator spacer components.

2. The method of claim 1, wherein said composite insulator spacers are formed on conductive gate structures of embedded dynamic random access memory (EDRAM), devices.

3. The method of claim 1, wherein said gate insulator layer is a silicon dioxide layer.

4. The method of claim 1, wherein said conductive gate structures are polysilicon gate structures.

5. The method of claim 1, wherein said first insulator layer is an undoped silicate glass(USG), layer, such as silicon oxide, obtained via LPCVD or PECVD procedures using silane or disilane, and nitrous oxide as reactants.

6. The method of claim 1, wherein said first insulator layer is a USG layer, such as a silicon rich, silicon oxide layer, featuring a refractive index between about 1.55 to 1.90.

7. The method of claim 1, wherein said second insulator layer is a silicon oxide layer, obtained via LPCVD or PECVD procedures, using TEOS as a source.

8. The method of claim 1, wherein said first phase of said anisotropic dry etch procedure is an anisotropic RIE procedure, performed using an etch ambient comprised of $CF_4/CHF_3$.

9. The method of claim 1, wherein said first phase of said anisotropic dry etch procedure features an etch rate ratio of said second insulator layer to said first insulator layer, of between about 1.5 to 1, to 10 to 1.

10. The method of claim 1, wherein said second phase of said anisotropic dry etch procedure is an anisotropic RIE procedure, performed using an etch ambient comprised of $C_4F_8/CO/Ar$.

11. A method of forming composite insulator spacers on the sides of polysilicon gate structures, on a semiconductor substrate, featuring a selective two phase anisotropic reactive ion etch procedure, comprising the steps of:

growing a silicon dioxide gate insulator layer on said semiconductor substrate;

forming said polysilicon gate structures on said silicon dioxide gate insulator layer;

depositing a silicon rich, undoped silica glass (USG), layer;

depositing a silicon oxide layer;

performing a first phase of said two phase anisotropic RIE procedure to form silicon oxide spacer components on said silicon rich, USG layer, with said first phase of said anisotropic RIE procedure selectively terminating on the top surface of said silicon rich, USG layer; and performing a second phase of said two phase anisotropic RIE procedure forming silicon rich, USG spacer components, and resulting in definition of said composite insulator spacers on sides of said conductive gate structure with each composite insulator spacer comprised of a silicon oxide spacer component overlying a silicon rich, USG spacer component, with said second phase of said anisotropic RIE procedure selectively terminating on top surface of said semiconductor substrate located in a space between said polysilicon gate structures.

12. The method of claim 11, wherein said composite insulator spacers are used as features of embedded dynamic random access memory (EDRAM), devices.

13. The method of claim 11, wherein said silicon dioxide gate insulator layer is obtained via a thermal oxidation procedure, performed in an oxygen-steam ambient.

14. The method of claim 11, wherein said silicon rich, USG layer, is a silicon oxide layer, obtained via LPCVD or PECVD procedures using silane or disilane, and nitrous oxide as reactants.

15. The method of claim 11, wherein the refractive index of said silicon doped, USG layer is between about 1.55 to 1.90.

16. The method of claim 11, wherein said silicon oxide layer is obtained via LPCVD or PECVD procedures using TEOS as a source.

17. The method of claim 11, wherein said first phase of said two phase anisotropic RIE procedure is performed using $CF_4/CHF_3$ as an etchant.

18. The method of claim 11, wherein said first phase of said two phase anisotropic RIE procedure is performed featuring an etch rate ratio of said silicon oxide layer to said silicon rich, USG layer, of between about 1.5 to 1, to 10 to 1.

19. The method of claim 11, wherein said second phase of said two phase anisotropic RIE procedure is performed using $C_4F_8/CO/Ar$ as an etchant.

20. The method of claim 11, wherein the etch rate ratio of said silicon rich USG layer to said semiconductor substrate, during said second phase of said two phase anisotropic RIE procedure using $C_4F_8/CO/Ar$ as an etchant, is between about 3 to 1, to 100 to 1.

21. The method of claim 11, wherein the etch rate ratio of said silicon rich USG layer to said silicon oxide, during said second phase of said two phase anisotropic RIE procedure using $C_4F_8/CO/Ar$ as an etchant, is between about 1.5 to 1, to 20 to 1.

* * * * *